US008712348B2

(12) United States Patent
Brobston et al.

(10) Patent No.: US 8,712,348 B2
(45) Date of Patent: Apr. 29, 2014

(54) APPARATUS AND METHOD FOR CONTROLLING A TUNABLE MATCHING NETWORK IN A WIRELESS NETWORK

(75) Inventors: Michael L. Brobston, Allen, TX (US); Xu Zhu, Allen, TX (US); Au Duy Bui, Dallas, TX (US); George Z. Hutcheson, Richardson, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 210 days.

(21) Appl. No.: 13/214,892

(22) Filed: Aug. 22, 2011

(65) Prior Publication Data
US 2012/0051409 A1 Mar. 1, 2012

Related U.S. Application Data

(60) Provisional application No. 61/379,218, filed on Sep. 1, 2010, provisional application No. 61/493,828, filed on Jun. 6, 2011.

(51) Int. Cl.
H04B 1/04 (2006.01)
H03H 7/40 (2006.01)
(52) U.S. Cl.
CPC ............ *H04B 1/0458* (2013.01); *H03H 7/40* (2013.01)
USPC .......................... 455/121; 455/123; 455/115.1
(58) Field of Classification Search
CPC ........... H04B 1/0458; H03H 7/38; H03H 7/40
USPC ............ 455/120, 121, 122, 123, 115.1, 115.3
See application file for complete search history.

(56) References Cited

U.S. PATENT DOCUMENTS

| 4,547,746 | A * | 10/1985 | Erickson et al. ............... 330/298 |
| 6,608,603 | B2 * | 8/2003 | Alexopoulos et al. ......... 343/860 |
| 7,239,289 | B2 * | 7/2007 | Kim ................................ 343/860 |
| 7,750,757 | B2 * | 7/2010 | Fukuda et al. ..................... 333/32 |
| 7,865,154 | B2 * | 1/2011 | Mendolia et al. ............... 455/125 |
| 7,917,096 | B2 * | 3/2011 | Wilcox .............................. 455/80 |
| 8,325,097 | B2 * | 12/2012 | McKinzie, et al. ............ 343/703 |
| 2002/0175870 | A1 | 11/2002 | Gleener |
| 2005/0093624 | A1 * | 5/2005 | Forrester et al. ............... 330/129 |
| 2005/0130699 | A1 * | 6/2005 | Kim ............................ 455/550.1 |
| 2005/0242879 | A1 * | 11/2005 | Muller ............................. 330/259 |
| 2006/0261911 | A1 * | 11/2006 | Fukuda et al. ..................... 333/32 |
| 2007/0149146 | A1 * | 6/2007 | Hwang et al. ..................... 455/80 |
| 2007/0194859 | A1 * | 8/2007 | Brobston et al. ............... 333/17.3 |
| 2007/0197180 | A1 * | 8/2007 | McKinzie et al. .......... 455/248.1 |
| 2010/0093293 | A1 | 4/2010 | Grebennikov et al. |
| 2010/0182216 | A1 | 7/2010 | Schmidhammer |

OTHER PUBLICATIONS

International Search Report dated Apr. 9, 2012 in connection with International Patent Application No. PCT/KR2011/006452, 3 pages.

* cited by examiner

*Primary Examiner* — Duc M Nguyen

(57) ABSTRACT

An apparatus and method manage impedance values in a radio in a wireless network. The apparatus includes a tunable matching network (TMN) positioned on a path between a transceiver and an antenna. The TMN includes a plurality of immittance elements. A voltage standing wave ratio (VSWR) detector is configured to detect a ratio of a signal passing the VSWR detector and a signal reflected from the TMN. A control circuit is configured to identify an operating setting for the radio, set a number of the immittance elements based on the operating setting, monitor the ratio detected by the VSWR detector, and modify a setting of at least one of the immittance elements based on the ratio detected.

21 Claims, 6 Drawing Sheets

APPARATUS AND METHOD FOR CONTROLLING A TUNABLE MATCHING NETWORK IN A WIRELESS NETWORK

CROSS-REFERENCE TO RELATED APPLICATION(S) AND CLAIM OF PRIORITY

The present application is related to U.S. Provisional Patent Application No. 61/379,218, filed Sep. 1, 2010, entitled "HYBRID CONTROL OF TUNABLE ANTENNA MATCHING" and U.S. Provisional Patent Application No. 61/493,828, filed Jun. 6, 2011, entitled "HYBRID CONTROL OF TUNABLE IMPEDANCE MATCHING". Provisional Patent Application Nos. 61/379,218 and 61/493,828 are assigned to the assignee of the present application and is hereby incorporated by reference into the present application as if fully set forth herein. The present application hereby claims priority under 35 U.S.C. §119(e) to U.S. Provisional Patent Application Nos. 61/379,218 and 61/493,828.

TECHNICAL FIELD OF THE INVENTION

The present application relates generally to impedance matching in electrical circuits and, more specifically, to controlling a tunable matching network.

BACKGROUND OF THE INVENTION

Efficient transfer of signal power to or from an antenna often requires that the transceiver circuit impedance be conjugate-matched to the antenna feed-point impedance. The feed-point impedances of mobile station antennas vary significantly over the frequencies and frequency bands assigned for cellular applications. The large frequency variation of antenna impedance prevents effective signal power transfer across all bands and results in less than desirable signal-to-noise ratio (SNR) in both the uplink and downlink cellular transmissions. Feed-point impedance characteristics of mobile station antennas also vary with the surrounding environments of the antennas. Objects in near proximity to an antenna (e.g., hand, head, table-top) significantly change frequency-dependent impedance profiles of mobile station antennas.

Radio frequency (RF) amplifiers for wireless equipment also suffer problems with impedance matching. A common issue in implementation of a multi-band or multi-mode power amplifier is in achieving optimum performance from the transmitter power amplifier over a broad frequency range or for multiple waveforms. The gain, linearity, and power-added efficiency (PAE) performance of a power amplifier (PA) is heavily dependent on the complex load impedance presented to the transistors within the PA. Based on the characteristics of the transistors, a specific complex load impedance or narrow range of load impedance values will provide the optimum PAE. Often the optimum output power is achieved at a specific complex load impedance that is at a different impedance value than that required to achieve optimum PAE.

In addition, the optimum linearity performance in terms of error vector magnitude (EVM), adjacent channel power ratio (ACPR), or two-tone intermodulation ratio (TTIR) is achieved at possibly different load impedance than that required to achieve optimum PAE or output power. Because the final power amplifier in a radio transmitter is a dominant factor in the overall power consumption, efficiency, and linearity of the transmitter, it is normally critical to transform the actual impedance of the load through an impedance matching network to present the ideal load impedance to the power amplifier transistors depending on which performance parameter must be optimized.

Passive matching networks provide adequate matching at one or more frequencies. However, passive matching networks are unable to provide antenna or power amplifier matching across multiple frequency bands. For antennas, passive matching is unable to adapt to impedance changes due to changes in the antenna environment or surroundings. For power amplifiers, passive matching is unable to adapt to impedance changes needed for operations at different performance parameters.

Therefore, there is a need in the art for an improved impedance matching circuitry. In particular, there is a need for a for a control circuit for a tunable matching network that is capable of managing impedance within a radio.

SUMMARY OF THE INVENTION

Exemplary embodiments of the present disclosure provide an apparatus for managing impedance values in a radio in a wireless network. The apparatus includes a tunable matching network (TMN) positioned on a path between a transceiver and an antenna. The TMN includes a plurality of immittance elements. A voltage standing wave ratio (VSWR) detector is configured to detect a ratio of a signal passing the VSWR detector and a signal reflected from the TMN. A control circuit is configured to identify an operating setting for the radio, set a number of the immittance elements based on the operating setting, monitor the ratio detected by the VSWR detector, and modify a setting of at least one of the immittance elements based on the ratio detected.

In another exemplary embodiment, a method for managing impedance values in a radio in a wireless network is provided. An operating setting for the radio is identified. A number of a plurality of immittance elements in a tunable matching network (TMN) positioned on a path between a transceiver and an antenna are set based on the operating setting. A detector detects a ratio of a signal passing the detector and a signal reflected from the TMN. A setting of at least one of the immittance elements is modified based on the ratio detected.

In yet another exemplary embodiment, a mobile station in a wireless network is provided. The mobile station includes an antenna, a front end module and a power amplifier. A first tunable matching network (TMN) is operably connected to the front end module and the antenna. The first TMN includes a first plurality of immittance elements. A first voltage standing wave ratio (VSWR) detector is configured to detect an antenna ratio of a signal from the front end module and a signal reflected from the first TMN. A second TMN is operably connected to the front end module and the power amplifier. The second TMN includes a second plurality of immittance elements. A second VSWR detector configured to detect a power amplifier ratio of a signal from the power amplifier and a signal reflected from the second TMN. A control circuit is configured to identify an operating setting for mobile station, set a number of the first plurality of immittance elements and a number of the second plurality of immittance elements based on the operating setting, modify settings of at least one of the first plurality of immittance elements in the TMN based on the antenna ratio detected by the first VSWR detector to match a value of impedance for the antenna with a value of impedance for the front end module, and modify settings of the plurality of immittance elements in the TMN to achieve a value for the power amplifier ratio that improves a performance parameter of the power amplifier based on the power amplifier ratio detected by the second VSWR detector.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless network.

Figure 1:
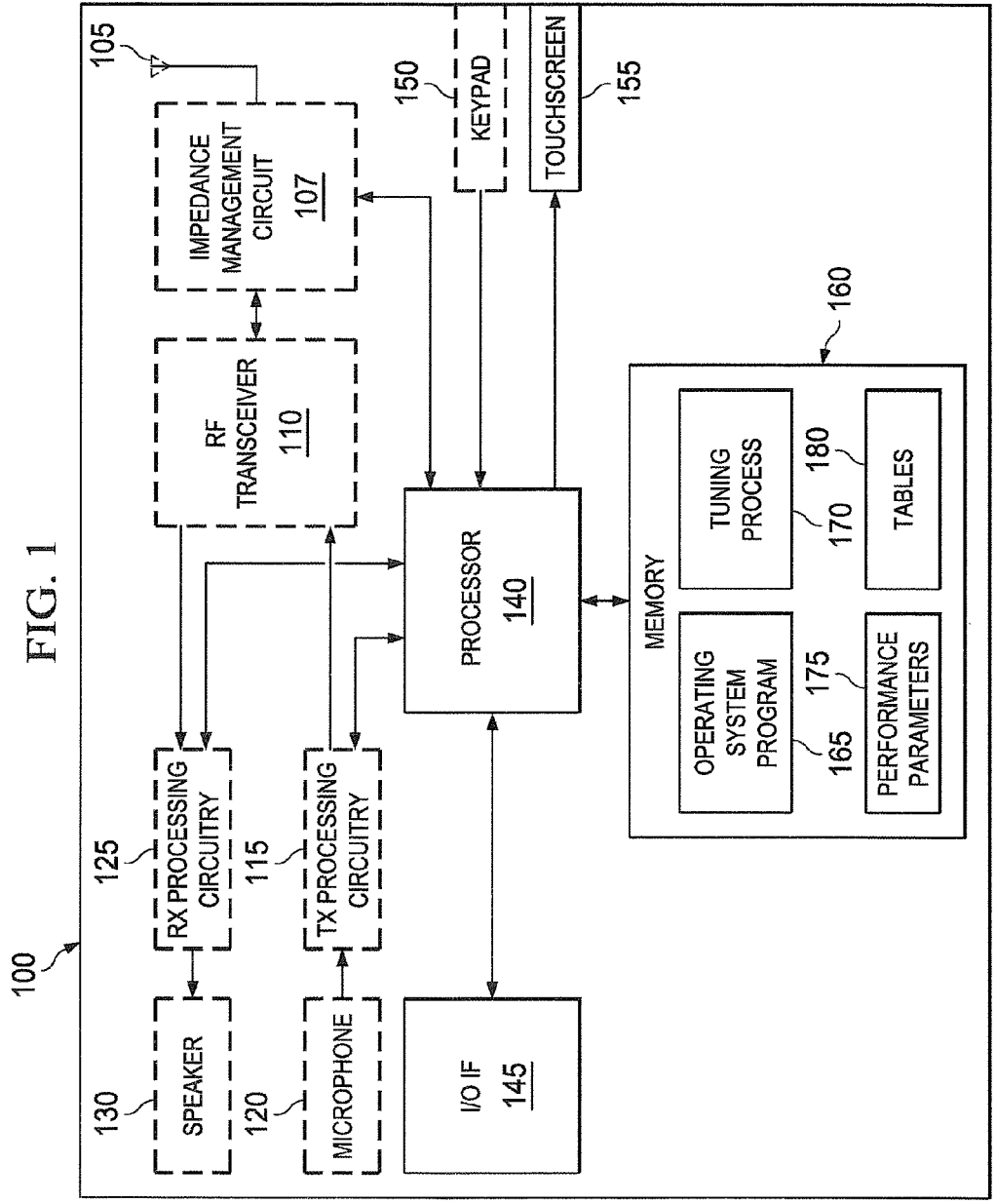
FIG. 1 illustrates a wireless mobile station according to the present disclosure.

FIG. 1 illustrates a wireless mobile station according to the present disclosure. Mobile station 100 comprises antenna 105, impedance management circuit, 107, frequency (RF) transceiver 110, transmit (TX) processing circuitry 115, microphone 120, and receive (RX) processing circuitry 125. Mobile station 100 also comprises speaker 130, processor 140, input/output (I/O) interface (IF) 145, keypad 150, touchscreen 155, and memory 160. Memory 160 further comprises basic operating system process 165, matching process 170, performance parameters 175, and tables 180. In these examples, mobile station 100 is a mobile device that can send and receive signals over a wireless network. For example, without limitation, mobile station 100 may be a handset, a mobile phone, a portable digital assistant, a laptop computer, a tablet computer, an electronic reader, and/or any other suitable mobile device.

Radio frequency transceiver 110 receives from antenna 105 an incoming RF signal transmitted by a base station of mobile station 100. Radio frequency transceiver 110 downconverts the incoming RF signal to produce an intermediate frequency (IF) or a baseband signal. The IF or baseband signal is sent to receiver (RX) processing circuitry 125, which produces a processed baseband signal by filtering, digitizing the baseband or IF signal, additional filtering, if necessary, demodulation and/or decoding. Receiver (RX) processing circuitry 125 transmits the processed baseband signal to speaker 130 (i.e., voice data) or to processor 140 for further processing (e.g., web browsing).

Transmitter (TX) processing circuitry 115 receives analog or digital voice data from microphone 120 or other outgoing baseband data (e.g., web data, e-mail, interactive video game data) from processor 140. Transmitter processing circuitry 115 encodes, modulates, multiplexes, and/or digitizes the outgoing baseband data to produce a processed baseband or IF signal. Radio frequency transceiver 110 receives the outgoing processed baseband or IF signal from transmitter processing circuitry 115. Radio frequency transceiver 110 up-converts the baseband or IF signal to a radio frequency signal that is transmitted via antenna 105.

In an exemplary embodiment of the present disclosure, processor 140 is a microprocessor or microcontroller. Memory 160 is coupled to processor 140. According to an advantageous embodiment of the present disclosure, part of memory 160 comprises a random access memory (RAM) and another part of memory 160 comprises a non-volatile memory, such as Flash memory, which acts as a read-only memory (ROM).

Processor 140 executes basic operating system (OS) program 165 stored in memory 160 in order to control the overall operation of mobile station 100. In one such operation, processor 140 controls the reception of forward channel signals and the transmission of reverse channel signals by radio frequency transceiver 110, receiver processing circuitry 125, and transmitter processing circuitry 115, in accordance with well-known principles.

Processor 140 is capable of executing other processes and programs resident in memory 160. Processor 140 can move data into or out of memory 160, as required by an executing process. Processor 140 is also coupled to input/output (I/O) interface 145. I/O interface 145 provides mobile station 100 with the ability to connect to other devices such as laptop computers and handheld computers. I/O interface 145 is the communication path between these accessories and processor 140.

Processor 140 is also coupled to keypad 150 and touchscreen 155. The operator of mobile station 100 uses keypad 150 to enter data into mobile station 100. Display 155 may be a liquid crystal display capable of rendering text and/or at least limited graphics from web sites. Alternate embodiments may use other types of displays.

In this exemplary embodiment, mobile station 100 includes impedance management circuit 107. Impedance management circuit 107 manages values for impedance between RF transceiver 110 and antenna 105. Impedance management circuit 107 may include one or more tunable matching networks (TMN) for managing the impedance values. In this example, processor 140 controls impedance management circuit 107 by modifying control variables of impedance management circuit 107 to manage impedance values. For example, processor 140 may process instructions from matching process 170 to control impedance management circuit 107 based on values detected within impedance management circuit 107.

Additionally, matching process 170 may configure impedance management circuit 107 for operation in different modes, operation bands, or operating environments. In one example, matching process 170 configures and adjusts control variables in impedance management circuit 107 based on performance parameters 175 stored in memory 160. Performance parameters 175 include desired values for components within RF transceiver 110 and antenna 105. Matching process 170 adjusts control variables to achieve performance parameters 175 for components.

Further, matching process 170 may utilize tables 180 to configure impedance management circuit 107 for operation in different modes, operation bands, or operating environments. For example, matching process 170 identifies a current operating mode, operation band, operating channel, and/or operating environment that mobile station 100 is operating. Matching process 170 can look up information in tables 180 to find initial values for control variables in impedance management circuit 107 for the current operating mode, operation band, operating channel, and/or operating environment. If the operating mode, operation band, operating channel, and/or operating environment changes, matching process 170 can reconfigure impedance management circuit 107 based on values in tables 180 for the new operating mode, operation band, operating channel, and/or operating environment.

While the description describes that certain embodiments of the present disclosure may be implemented in mobile stations or handsets, the various embodiments of the present disclosure may also be implemented in any suitably arranged base station and/or relay station.

The various embodiments of the present disclosure recognize and take into account a number of considerations. For example, the various embodiments recognize and take into account that several means have been proposed and implemented to provide tunable impedance matching for both antennas and power amplifiers. These tunable matching techniques can include three elements: a tunable impedance device of some form, a tunable matching network (TMN) composed of the tunable device and passive elements, and a control circuit with some form of an algorithm to adjust the tunable device for best impedance matching based upon the frequency, antenna environment, and power amplifier operating requirements. Many technologies have been investigated or used for antenna and power amplifier matching including varactor diodes as tunable capacitors, micro-electromechancial systems (MEMS) tunable capacitors and inductors, ferro-electric and para-electric tunable capacitors, silicon-on insulator and/or silicon-on-sapphire switches with fixed capacitors.

Additionally, the various embodiments recognize and take into account that control schemes for tunable matching of power amplifier and antenna impedances are generally of two classes: closed loop control and open loop control. In closed loop control, certain aspects of the match between the antenna and the transceiver or the matching between the power amplifier output and the power amplifier load are monitored or measured. For example, the measured quantity is the voltage standing wave ratio (VSWR) or reflected power from the matching circuit with the tunable device. The tunable device can then be adjusted by the closed loop circuit to drive the impedance match to an acceptable or optimum level based on the measured quantity. For open loop control, the impedance match is adjusted to a desired state or setting previously known for a given antenna environment, operating band, operating channel, and operating mode or to a desired state or setting previously known for the operating frequency and performance parameters of the power amplifier. The tunable device is then adjusted to the state that most closely matches the environmental conditions of the antenna for the operating band, operating channel and operating mode that are stored in memory.

The various embodiments further recognize and take into account that, for antennas, open loop control assumes that all mobile stations will be exposed to the same set of antenna environments and that the set of antenna environments are the same for all units of the same mobile station model, the same for all users of the mobile station, and the same over the life of the mobile station product. However, the actual conditions of use for the millions of units of a single mobile station model and the conditions of use by millions of customers of that mobile station model cannot be adequately characterized in a limited set of assumed use conditions and cannot be precisely determined from laboratory tests. Each mobile station user handles, holds, and operates a mobile station in subtly different ways from laboratory analogs and from the millions of other users.

The various embodiments further recognize and take into account that, for power amplifiers, open loop control assumes that power amplifier output and load impedances are constant from unit-to-unit, constant across all environmental conditions, and unchanging over the entire life of the product. However, in actual use, power amplifier output and load impedances vary due to a number of factors. Variations in the components of the transmitter chain due to temperature, age, and component tolerances lead to variations in the load impedances of power amplifiers. Similarly, temperature, age, and device tolerances of power amplifiers cause variations in the output impedances of power amplifiers. Changes in antenna impedances due to proximity effects also cause variations in the load impedances of power amplifiers.

The various embodiments also recognize and take into account that closed loop control of antenna matching may not provide practical matching for mobile station radios. Since signal strengths received by mobile stations are often too weak for use in the control circuits, closed loop control systems optimize antenna matching to the frequency with the stronger signal of the wireless connection, for example the mobile station transmitter frequency. The antenna match optimized to one frequency, for example, the transmitter frequency, comes at the expense of the other frequency, the receiver frequency. The control or feedback circuits strongly converge on the transmitter frequency resulting in a very narrow band impedance match centered on the transmitter frequency but with very poor or inadequate matching at the receiver frequency. The signals at the transmitter and receiver frequencies become significantly asymmetric resulting in poor two-way communications.

Effective tunable impedance matching in mobile products requires matching networks with multiple tunable devices and, as a result, multiple control variables that must be managed by the control circuit. The complexity and convergence time of closed loop control circuits grow exponentially as the number of control variables increases. Fast converging, low power, and inexpensive closed loop control circuits are difficult to realize and implement for practical impedance matching for mobile stations.

Thus, the various embodiments recognize that both open and closed loop control schemes suffer from the lack of standard electronic hardware and software interfaces available for the interconnection of the tunable impedance matching circuits to the mobile station modem electronics. Present mobile station products also use a variety of chipsets from different chipset manufacturers. Most chipsets use a similar digital serial communication interface for fast messaging between the chipset baseband and the front-end components or circuit blocks. However, each manufacturer has subtly but significant differences in the implementation of the serial communication interface that complicate the integration of a single tunable matching design across multiple wireless chipsets and mobile station models. Where the combination of a modem and matching control circuit are new, the interface for the tunable matching network must be re-adapted, modified, or re-designed to mate to the modem chipset communication protocol. The repeated re-design of the tunable matching network interface to the modem increases the mobile station product design time, increases the time to market of the mobile station product and reduces the financial benefit of tunable antenna matching.

Thus, the various embodiments provide an apparatus for managing impedance values in a radio in a wireless network. The apparatus includes a tunable matching network (TMN) positioned on a path between a transceiver and an antenna. The TMN includes a plurality of immittance elements. A voltage standing wave ratio (VSWR) detector is configured to detect a ratio of a signal passing the VSWR detector and a signal reflected from the TMN. A control circuit is configured to identify an operating setting for the radio, set all or a portion of the immittance elements based on the operating setting, monitor the ratio detected by the VSWR detector, and modify a setting of at least one of the immittance elements based on the ratio detected.

Figure 2:
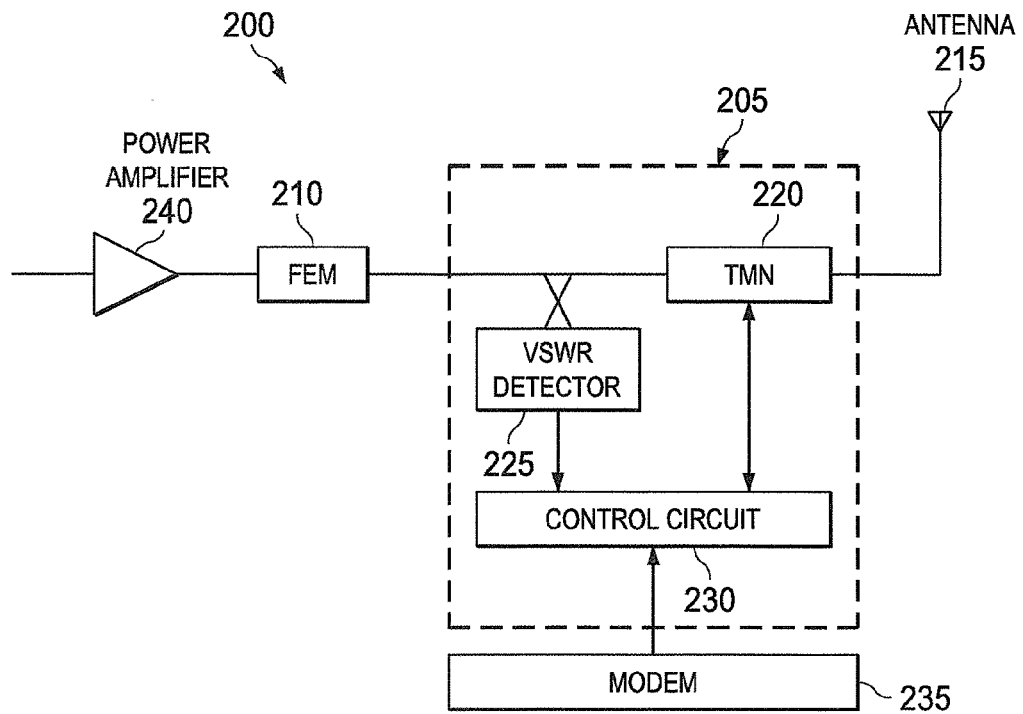
FIG. 2 illustrates an impedance management circuit for an antenna in a radio according to the present disclosure.

FIG. 2 illustrates an impedance management circuit for an antenna in a radio according to the present disclosure. In this illustrative example, impedance management circuit 205 in radio 200 is an example of one implementation of impedance management circuit 107 in mobile station 100.

In this illustrative example, impedance management circuit 205 is a control system for matching impedance values between front end module (FEM) 210 and antenna 215. Impedance management circuit 205 includes TMN 220, VSWR detector 225, and control circuit 230. TMN 220 includes a number of tunable and fixed immittance elements. For example, immittance elements in TMN 220 may include, for example, without limitation, fixed or tunable capacitors, inductors, MEMS capacitors or switches, ferro- or para-electric capacitors, silicon on insulator CMOS switches, varactor diode capacitors. These immittance elements may be controlled or switched to be placed in parallel or series with front end module 210 and antenna 215 to adjust the impedance between front end module 210 and antenna 215. Front end module 210 may include a duplexer for frequency division duplexing (FDD) applications or a filter plus transmit/receive (T/R) switch for time division duplexing (TDD) applications.

TMN 220 has multiple control variables for impedance matching. Each control variable controls the tuning or switching of one or more immittance elements. The control variables are controlled by control circuit 230. Examples of various configurations for tunable matching networks may be found in U.S. Pat. No. 7,332,980, entitled "SYSTEM AND METHOD FOR A DIGITALLY TUNABLE IMPEDANCE MATCHING NETWORK," assigned to the assignee of the present application and incorporated herein by reference.

VSWR detector 225 provides an analog output signal to control circuit 230. The output signal is monotonically related to the voltage reflected from TMN 220 by the incident voltage wave from FEM 210. The output from VSWR detector 225 may be in the form of the magnitude only, phase only, or both magnitude and phase of the reflected voltage from TMN 220.

Control circuit 230 provides feedback control functions of for controlling TMN 220. Control circuit 230 may be implemented as an integrated circuit (IC) in TMN 220, as an application specific IC (ASIC), as some form of a programmable IC, as a micro-controller, or some combination of implementations. In one embodiment, control circuit is implemented by processor 140 of mobile station 100.

In this illustrative example, control circuit 230 modifies control variables of TMN 220 to achieve desired values for impedance between front end module 210 and antenna 215. In configuring TMN 220, control circuit 230 identifies a current operating band and/or operating mode for radio 200 from modem 235. Upon configuration, control circuit 230 monitors the VSWR output from VSWR detector 225. If the VSWR output has values that are outside desired values, control circuit 230 modifies control variables in TMN 220 to improve VSWR output values. In one example, a VSWR output of 1 is desired, such that the signal from FEM is transmitted to antenna 215 without reflection.

In this illustrative example, radio 200 also includes power amplifier 240. In some embodiments, control circuit 230 modifies control variables of TMN 220 to achieve desired values for impedance for both antenna 215 and power amplifier 240. In other embodiments, a second control circuit may be included between FEM 210 and power amplifier 240 for managing impedance matching for power amplifier 240.

Figure 3:
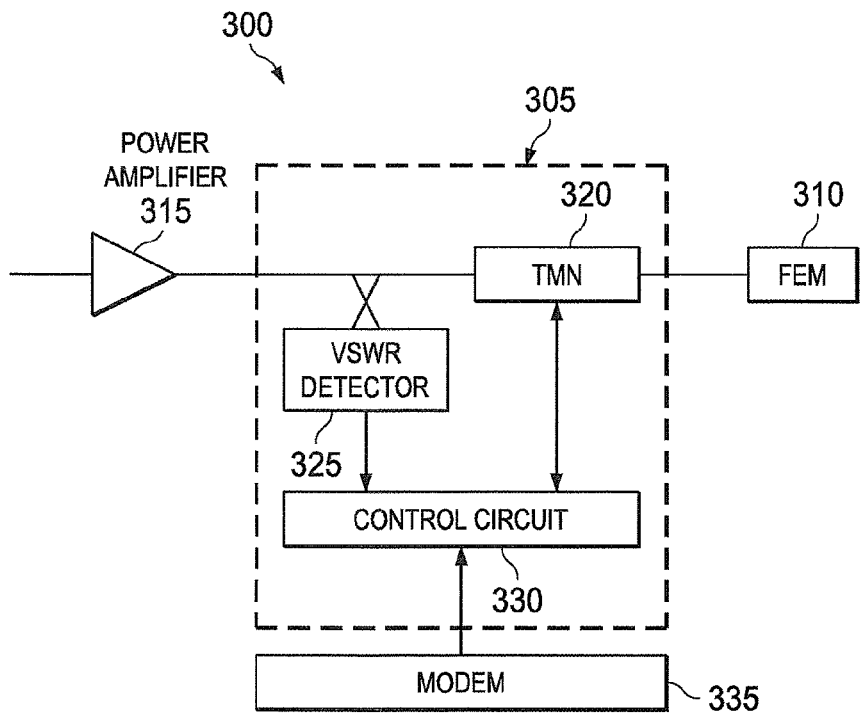
FIG. 3 illustrates an impedance management circuit for power amplifier in a radio according to the present disclosure.

FIG. 3 illustrates an impedance management circuit for power amplifier in a radio according to the present disclosure. In this illustrative example, impedance management circuit 305 in radio 300 is an example of one implementation of impedance management circuit 205 in radio 200.

In this illustrative example, impedance management circuit 305 is a control system for managing impedance values between front end module (FEM) 310 and power amplifier (PA) 315. Impedance management circuit 305 includes TMN 320, VSWR detector 325, and control circuit 330. TMN 320 includes a number of tunable and fixed immittance elements. For example, TMN 320 is an implementation of TMN 220. Also, VSWR detector 325 is an implementation of VSWR detector 325.

In this illustrative example, control circuit 330 modifies control variables of TMN 320 to achieve desired values for impedance between power amplifier 315 and front end module 310. In configuring TMN 320, control circuit 330 identifies a current operating band, operating channel, and/or operating mode for radio 300 from modem 235. Upon configuration, control circuit 330 monitors the VSWR output from VSWR detector 325. If the VSWR output has values that are outside desired values, control circuit 330 modifies control variables in TMN 320 to improve VSWR output values.

For example, power amplifier impedance matching may have similar operations as antenna matching. However, TMN 320 has been configured for operation, control circuit 330 attempts to converge the VSWR output to a target value that is desired for a particular performance parameter of PA 315. In some example, the desired VSWR value may not be a minimum value but some intermediate value that provides desired levels for efficiency, linearity, modulation quality, output power, and/or some other performance parameter of PA 315.

Figure 4:
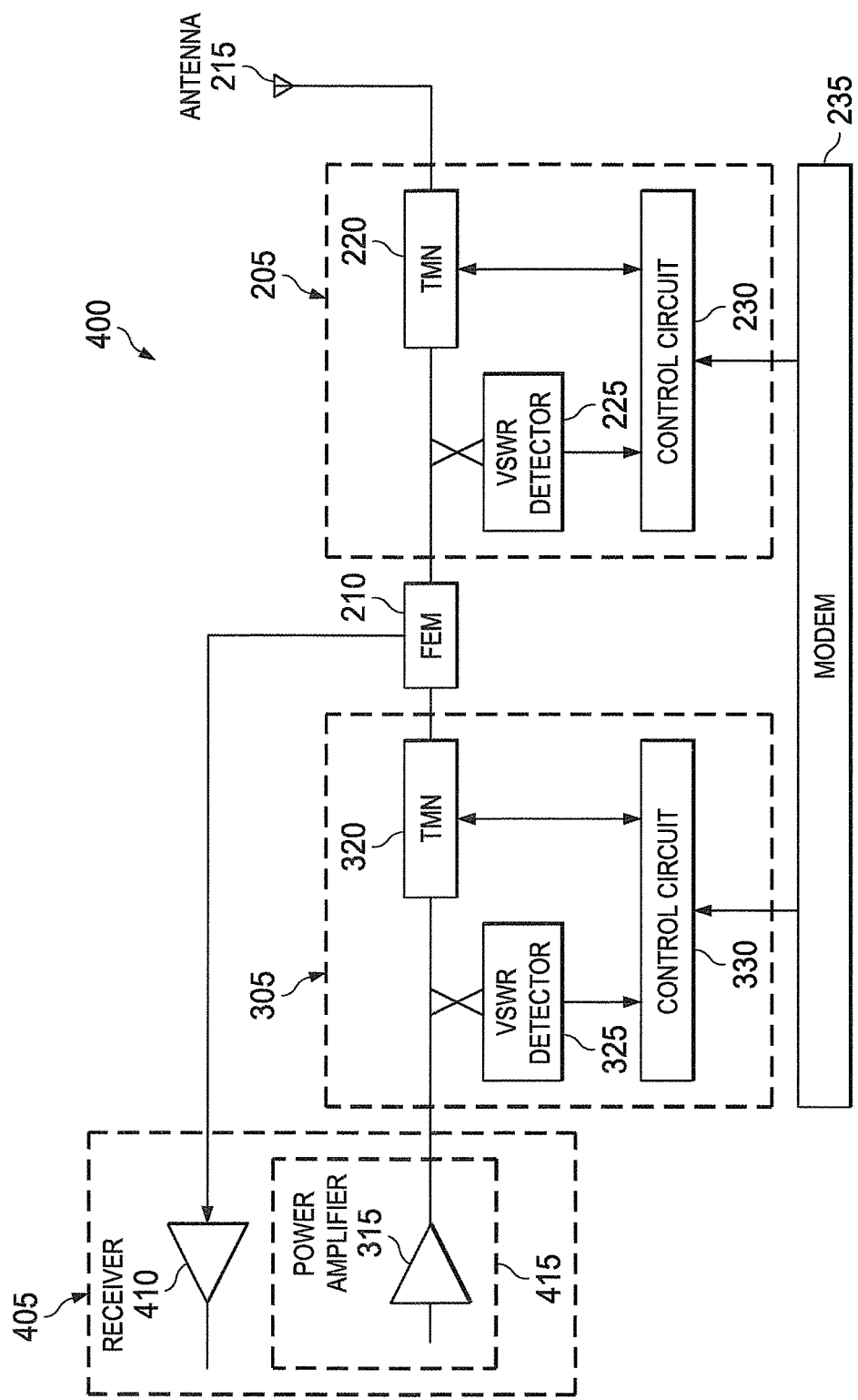
FIG. 4 illustrates a pair of impedance management circuits in a radio according to the present disclosure.

FIG. 4 illustrates a pair of impedance management circuits in a radio according to the present disclosure. In this illustrative embodiment, radio 400 includes both impedance management circuit 205 and impedance management circuit 305. Radio 400 also includes transceiver 405. Transceiver 405 is an example of one implementation of RF transceiver 110 in mobile station 100.

In this illustrative example, impedance management circuit 205 is positioned between FEM 210 and antenna 215. Impedance management circuit 205 provides hybrid control, open loop and closed loop control, to manage impedance values between FEM 210 and antenna 215. Impedance management circuit 305 is positioned between PA 315 and FEM 210. Impedance management circuit 305 provides hybrid control to manage impedance values between PA 315 and FEM 210.

The hybrid controlled impedance matching implemented in radio 400 provides matching performance with desired levels of complexity and cost. For example, in initially configuring radio with open loop control, TMNs 220 and 320 may be initially adjusted to a predetermined matching state based upon the frequency channel used by modem 235, surrounding environment of 215, and the mechanical configuration of the mobile station. Partial closed loop matching control of TMNs 220 and 320 is initiated with the already established open loop matching state. The closed loop control is formed by the control a number of the control variables for TMNs 220 and 320.

For TMN 220 the degree of matching impedance for antenna 215 is measured by VSWR detector 225. A process implemented by control circuit 230 calculates a desired value or values of the control variables for immittance elements in TMN 220 to reduce the reflected voltage detected by VSWR detector 225. The control circuit 230 sends the desired control variable values to TMN 220. The improved impedance match is recognized between FEM 210 and antenna 215. These operations may be repeated to maintain and adjust impedance matching to account for dynamic conditions within the environment surrounding radio 400. The operations may be repeated until interrupted by new commands sent by the modem 235 or processor 140. Antenna impedance matching for frequency division duplexing (FDD) operations is ensured by including slight changes to the matching states stored in non-volatile memory and by including certain elements to the feedback control process to prevent and avoid narrow band matching.

A description of simultaneous matching at two frequencies (TX and RX) using the feedback at one frequency (TX) by the closed loop part of hybrid control is as follows. The impedance matches at both the feedback (TX) and secondary (RX) frequencies are evaluated for the open loop settings of the TMN control variables for all the operating bands operating channels, operating modes, and antenna environments. The open loop settings are used as the initial TMN settings for the closed loop but modifications are made to the setting values based on the evaluation. The modifications are made to provide a reasonable compromise of the impedance match between the two frequencies. The specific control variables in the TMN selected for closed loop operations are those that provide a reasonable compromise of the impedance match between the two frequencies. The compromise may include decreasing or increasing the number of control variables used for the closed loop as compared to single frequency matching. Based on the evaluation, the range of one or more of the TMN control variables used for closed loop operations may be restricted to maintain a reasonable impedance match at both frequencies.

Hybrid control of impedance matching for PA 315 is similar to antenna matching. For example, power amplifier impedance matching follows the same steps as antenna matching. However, once in partial closed loop operations, the control circuit 330 attempts to converge the VSWR to a target value that is desired for a particular performance parameter of PA 315. For example, the desired VSWR value may not be the minimum value but some intermediate value that provides a desired value for power amplifier efficiency, linearity, modulation quality, output power, or other performance parameter.

Hybrid control provides real-time impedance matching around the previously determined and desired matching states in radio 400. The partial closed loop impedance matching compensates for unanticipated, unplanned, unit-to-unit, and time varying impedances that lead to poor product performance with open loop control alone. System responses to any impedance changes are quick since the matching process modifies one or a few control variables. Convergence of the partial closed loop too far from acceptable matching values is avoided by using the predetermined or open loop control variables values for some of the control variables and using the open loop states as the initial conditions for the partial closed loop control scheme. Narrow band antenna matching is improved by combining some fixed control variables of TMNs 220 and 320 with one or a few control variables that are modified by the partial closed loop circuit to obtain the best compromise in antenna matching for both uplink and downlink frequencies.

TMNs 220 and 230 include multiple control variables of which all or some of the control variables may be adjusted by the partial closed loop configuration for antenna or power amplifier matching. The partial closed loop control may be formed by any number of combinations of VSWR detector output variables and any number of TMN control variables. However, the complexity, convergence time, and cost of the partial closed loop configuration may increase as the number of VSWR detector output variables and number of TMN control variables used in the loop increase. A first order loop formed from a single VSWR output variable and a single TMN control variable may be used for the partial closed loop control scheme. With only one TMN control variable adjusted, the control circuit may be able to adjust the control variable based on the VSWR output magnitude value. A first order feedback control loop is formed by adjusting one control variable based on only the VSWR output magnitude value. More than one VSWR output variable and more than one TMN control variable may be added to the partial control loop for improved antenna and power amplifier matching performance. However, additional control loops may result in additional processing costs.

The illustration of radio 400 is not meant to imply physical or architectural limitations to the manner in which different embodiments may be implemented. Other components in addition to and/or in place of the ones illustrated may be used. Some components may be unnecessary in some illustrative embodiments. Also, the blocks are presented to illustrate some functional components. One or more of these blocks may be combined and/or divided into different blocks when implemented in different embodiments.

For example, in some embodiments, only one controller may be used for both impedance management circuit 205 and impedance management circuit 305. The controller may monitor values from both VSWR detector 225 and VSWR detector 325 to manage both TMN 220 and TMN 320. In one example, the controller is a processor or microcontroller for a mobile station. In other examples, the controller is a separate controller for managing impedance values in radio 400.

In various embodiments, radio 400 may include only one impedance management circuit for managing impedance values. For example, radio 400 may include either impedance management circuit 205 or impedance management circuit 305. In this example, either impedance management circuit 205 or impedance management circuit 305 may manage matching of impedance for both antenna 215 and power amplifier 315. In other examples, radio 400 may include any number of impedance management circuits for managing impedance values at various points within radio 400.

Figure 5:
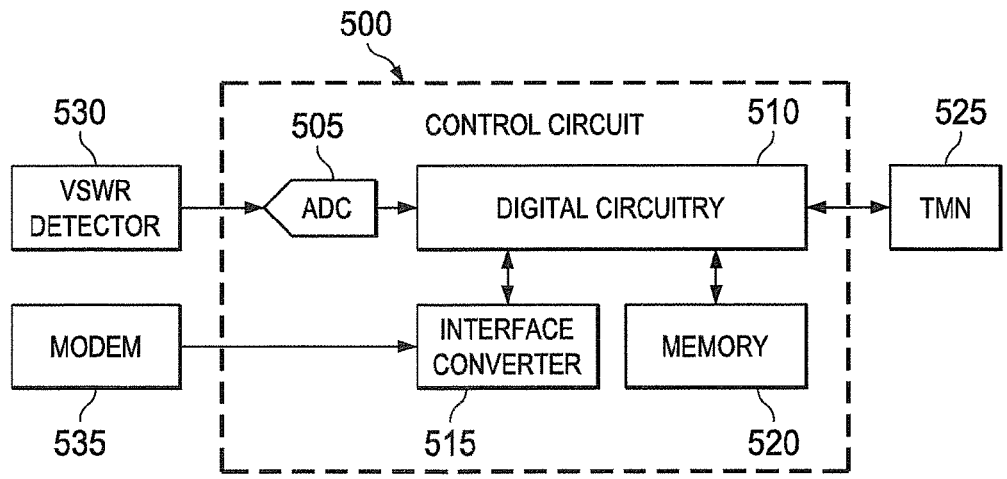
FIG. 5 illustrates a control circuit according to the present disclosure.

FIG. 5 illustrates a control circuit according to the present disclosure. In this illustrative embodiment, control circuit 500 is an example of one implementation of control circuits 230 and 330. Control circuit 500 includes analog-to-digital converter (ADC) 505, digital circuitry 510, interface converter 515, and memory 520.

In this illustrative example, digital circuitry 510 controls TMN 525 based on signals from VSWR detector 530. For example, without limitation, digital circuitry 510 may includes a series of finite state machines, digital logic circuits, a microprocessor and/or some combination thereof. ADC 505 converts the analog signal from VSWR detector 530 to a digital format compatible with digital circuitry 510. Interface converter 515 converts the digital communication format or protocol from modem 535 to a format usable by digital circuitry 510.

Memory 520 stores look-up tables that are used for control of the impedance matching. Memory 520 may be permanent, for example, read-only memory, reprogrammable but non-volatile memory (NVM), or volatile memory for example random access memory (RAM). In one example, memory 520 is memory 160 for mobile station 100. In another example, memory 520 is specific for use in control circuit 500.

The predetermined or open loop matching states for the TMN control variables are stored in memory 520. Multiple look-up tables may also be stored in memory 520. Each table contains desired matching settings for TMN 525 for different known antenna or power amplifier operating conditions. The look-up tables are predetermined. The specific implementation of the hybrid control is determined when the look-up tables are loaded into memory 520.

The tunable antenna and power amplifier matching operations performed by control circuit 500 may be simplified by placing the impedance matching look-up tables in memory 520. Control circuit 500 identifies the operating parameters for the antenna or the power amplifier based upon known operating parameters. For example, the operating parameters may include frequency channel, output power, and modulation protocol or may be based upon inputs from other devices or functions of the mobile station, for example, a proximity sensor on the mobile station. Modem 535 may provide the operating parameters to control circuit 500 using a coded message. Digital circuitry 510 receives the message from modem 535 and matches the code of the message to a location in the look-up tables in memory 520. Values for TMN control variables are read from the memory 520. Digital circuitry 510 sends the control variables from memory 520 to TMN 525 where the open loop part of the hybrid control is performed.

In these examples, antenna and power amplifier impedance matching with TMN 525 within a frequency band or within specific operating conditions is sensitive to one or a few of the control variables of TMN 525. Digital circuitry 510 selects the control variables that are sensitive based on the operating conditions for adjustment during closed loop control. The look-up tables within memory 520 may include the control variables to be adjusted for partial closed loop control. When control circuit 500 receives a new message from modem 535, digital circuitry 510 may read a new look-up table that includes the control variable for the partial closed loop matching. Digital circuitry 510 provides the partial closed loop control using the control variable or variables specified in the look-up table.

Interface converter 515 allows for customization control circuit 500 to the digital communications format of different the mobile station modems or baseband chipsets. For example, in some embodiments, interface converter 515 may be implemented as a block of fully integrated circuitry that may be re-wired through metal mask changes. In other examples, interface converter 515 may be a block of reprogrammable digital logic circuitry, or may be implemented as a function of a microcontroller. Depending upon implementation, interface converter 515 may be modified to the digital communications protocol or format of the modem or baseband chipset. The flexibility of interface converter 515 allows the control circuit 500 to be connected to different modem or baseband chipsets with reduced hardware or software development.

Figure 6:
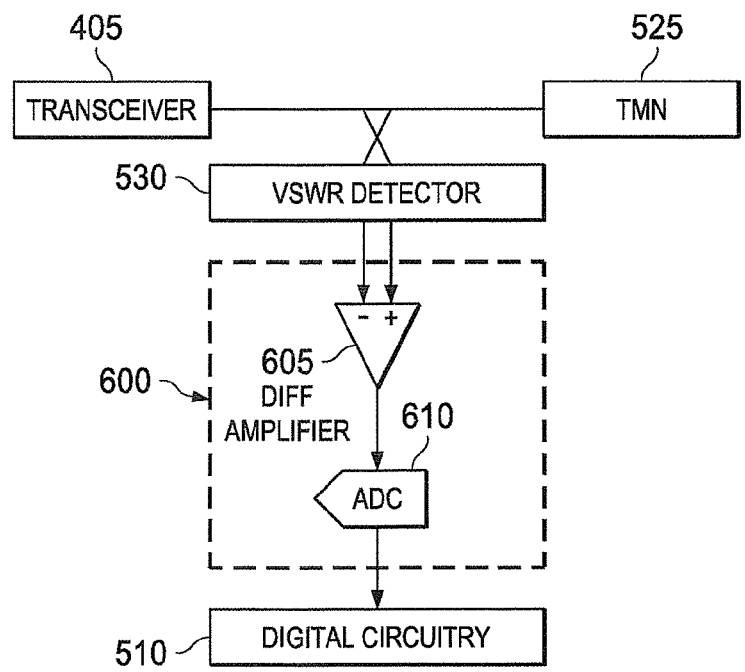
FIG. 6 illustrates an example implementation for an interface between a detector and a digital circuit according to the present disclosure.

FIG. 6 illustrates an example implementation for an interface between a detector and a digital circuit according to the present disclosure. Interface 600 is one example of an interface between VSWR detector 530 and digital circuitry 510. The use of differential amplifier 605 and ADC 610 provides output values from VSWR detector 530 for magnitude or phase differences in signals from transceiver 405 and reflected by TMN 525.

Figure 7:
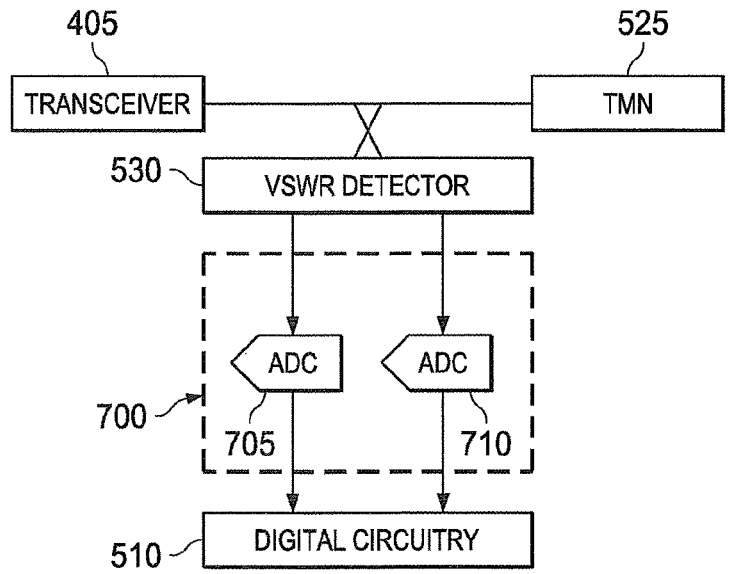
FIG. 7 illustrates another example implementation for an interface between a detector and a digital circuit according to the present disclosure.

FIG. 7 illustrates another example implementation for an interface between a detector and a digital circuit according to the present disclosure. Interface 700 is one example of an interface between VSWR detector 530 and digital circuitry 510. The use of ADC 705 and ADC 710 provides output values from VSWR detector 530 for magnitude and phase differences in signals from transceiver 405 and reflected by TMN 525.

The illustration of interfaces 600 and 700 are not meant to imply physical or architectural limitations to the manner in which different illustrative embodiments may be implemented. The two example VSWR detector and ADC combinations do not represent all possible configurations of these two circuit blocks for hybrid control. Other components in addition to and/or in place of the ones illustrated may be used. One or more of the blocks may be combined and/or divided into different blocks when implemented in different embodiments.

Figure 8:
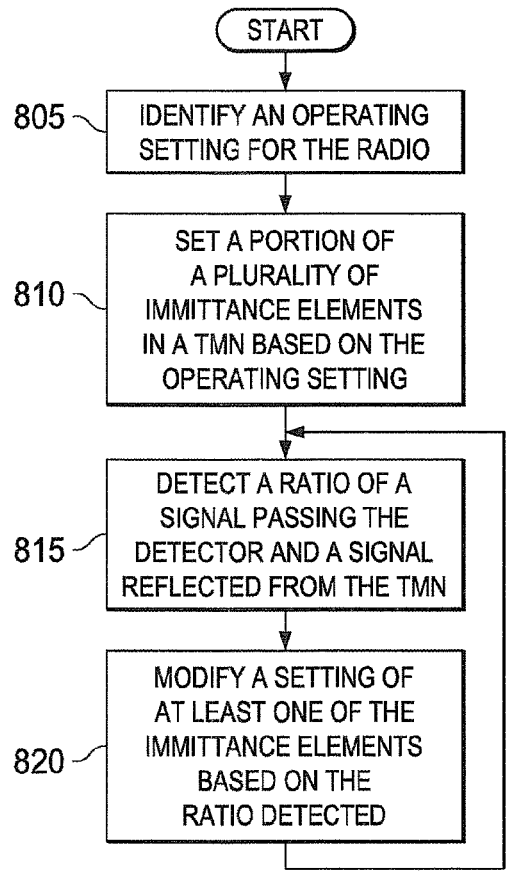
FIG. 8 illustrates a process for managing impedance values in a radio in a wireless network according to the present disclosure.

FIG. 8 illustrates a process for managing impedance values in a radio in a wireless network according to the present disclosure. The process illustrated in FIG. 8 may be implemented by control circuit 230 and/or control circuit 330 in radio 400. The process may also be implemented by matching process 170 in mobile station 100.

The process begins by identifying an operating setting for the radio (block 805). In block 805, the operating setting may be an operating band, operating channel, an operating mode, and/or conditions present in the operating environment of an antenna or transceiver of a radio. The process then sets all or a portion of a plurality of immittance elements in a TMN based on the operating setting (block 810). In block 810, the portion of the immittance elements may be set based on values for control variables for the operating setting for the operating conditions of the radio.

Thereafter, the process detects a ratio of a signal passing the detector and a signal reflected from the TMN (block 815). In block 815, the signal includes a VSWR of signal passing the detector and a signal reflected from the TMN. The process then modifies a setting of at least one of the immittance elements based on the ratio detected (block 820). In block 820, the process may modify one or more control variables of the TMN to improve the VSWR. If the detected VSWR is already at a desired value, block 820 may consist of doing nothing. The process then returns to block 815 and monitors the VSWR. The process may continue to monitor VSWR and adjust control variables of the TMN for a period of time. The process may end, when monitoring of the VSWR is no longer desired.

Figure 9:
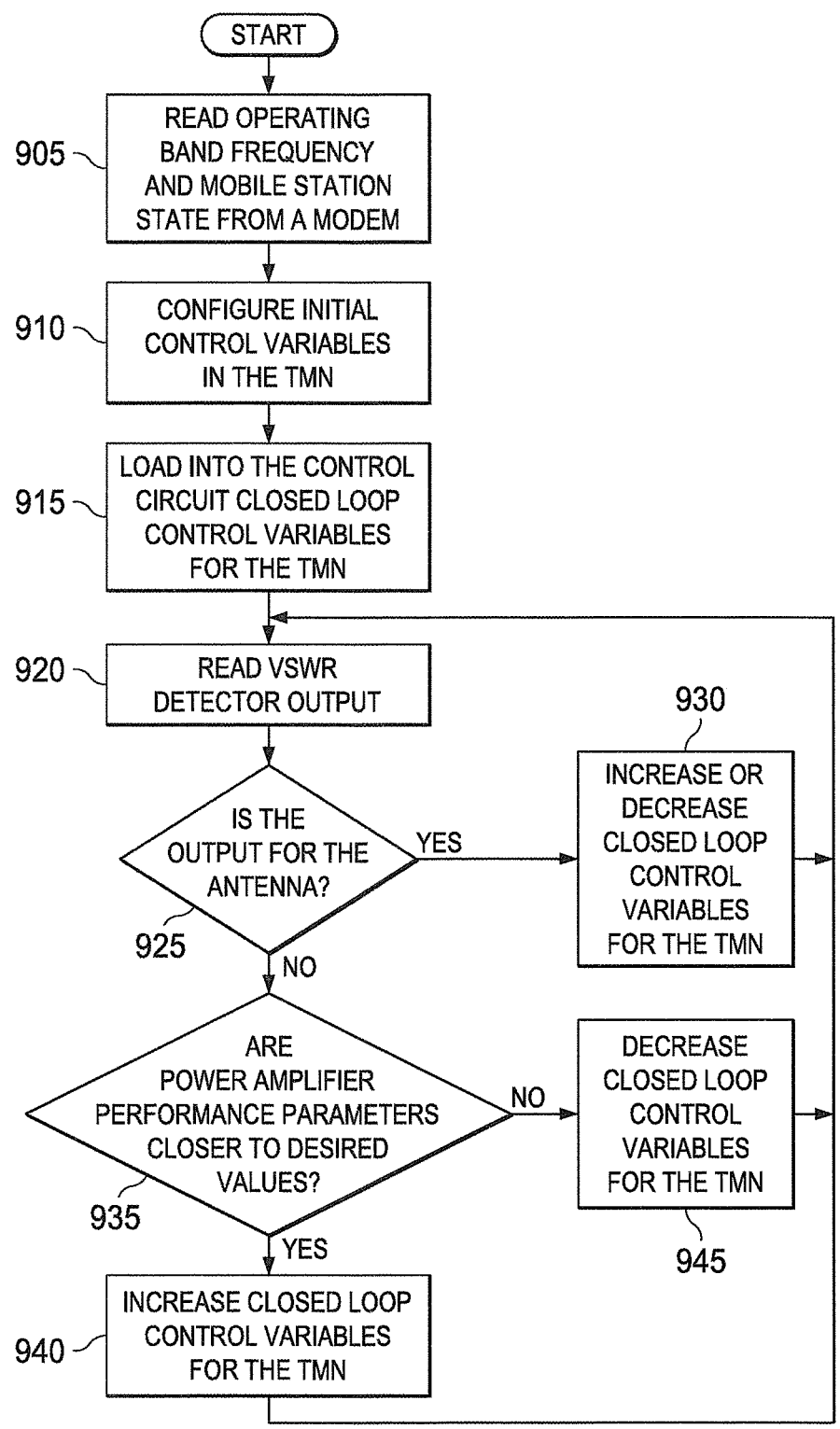
FIG. 9 illustrates a process for managing control variables in a tunable matching network according to the present disclosure.

FIG. 9 illustrates a process for managing control variables in a tunable matching network according to the present disclosure. The process illustrated in FIG. 8 may be implemented by control circuit 230 and/or control circuit 330 in radio 400. The process may also be implemented by matching process 170 in mobile station 100.

The process begins by reading operating band frequency and mobile station state from a modem (block 905). The process then configures initial control variables in the TMN (block 910). In block 910, the initial configuration of the TMN includes the open loop control of the TMN. Thereafter, the process loads into the control circuit closed loop control variables for the TMN (block 915). In block 915, the control variables to be managed may be selected based on the operating conditions. For example, the operating conditions may be identified as sensitive to the control variables loaded.

The process then reads VSWR detector output (block 920). Thereafter, the process determines whether the output is for the antenna (block 925). If the process determines that the output is for the antenna, the process increases or decreases closed loop control variables for the TMN (block 930) and returns to block 920. In block 930, the process matches impedance for an antenna. For example, if the control circuit is just managing impedance values for the antenna, then block 925 may not be necessary.

If, however, the process determines that the output is for the power amplifier, the process determines whether power amplifier performance parameters are closer to desired values (block 935). In block 935, the process matches impedance for a power amplifier. For example, if the control circuit is just managing impedance values for the power amplifier, then block 925 may not be necessary.

If the process determines that power amplifier performance parameters are closer to desired values, the process increases closed loop control variables for the TMN (block 940) and returns to block 920. If, however, the process determines that power amplifier performance parameters are not closer to desired values, the process decreases closed loop control variables for the TMN (block 945) and returns to block 920. In blocks 940 and 945, the process attempts to converge the VSWR to a target value that is desired for a particular PA performance parameter. For example, the desired VSWR value may not be the minimum value but some intermediate value that provides the best power amplifier efficiency, linearity, modulation quality, output power, or other performance parameter.

The various embodiments of the present disclosure provide several improvements. For example, the various embodiments compensate in real-time, for reduced wireless signal strength due to degradations induced by objects near or in the surrounding environment of mobile station antennas. Particularly egregious are the effects of users' hand and heads in reducing signal strength when the users hold mobile stations. The antenna and power amplifier matching improvement provided by the hybrid control of impedance matching recovers much of the lost signal strength due to these hand and head effects.

The various embodiments of the present disclosure recognize that signal strength degradation is different from user-to-user and mobile station-to-mobile station and can change as users change grip, change ear, and move about. Hybrid control addresses these issues and provides real-time signal strength improvements as mobile station products are handled and repositioned by the user or as objects that degrade signal strength move around and near the mobile station.

Additionally, hybrid control does not sacrifice the signal strength in one direction of the wireless link to improve the signal strength in the other direction. Hybrid control according to the present disclosure provides real time enhancement of both uplink and downlink signals, avoids disproportionate signal strengths in the two directions of communications, and ensures good two-way communications. Hybrid control will provides improved network carrier and end user satisfaction with terminal products. Better signal strengths from hybrid control will provide better wireless connection reliability, will minimize stresses within wireless networks, and will allow better utilization network resources.

Aspects of the present disclosure provide other benefits in the design and manufacturing of wireless terminal products. The various embodiments of the present disclosure include a flexible control interface that will allow configuration and mating to different digital control interfaces. The adaptation of the hybrid control module to new and existing modem chipset control protocols reduces time and effort in connecting tunable matching devices to modem chipsets.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus for managing impedance values in a radio in a wireless network, the apparatus comprising:
   a first tunable matching network (TMN) positioned on a path between a transceiver and at least one antenna, the first TMN comprising a first plurality of immittance elements;
   a front end module operably connected to the first TMN and the transceiver,
   a first voltage standing wave ratio (VSWR) detector configured to detect a ratio of a signal from the front end module passing the first VSWR detector and a signal reflected from the first TMN;
   a second TMN operably connected to the front end module and a power amplifier in the transceiver, the second TMN comprising a second plurality of immittance elements;
   a second VSWR detector configured to detect a power amplifier ratio of a signal from the power amplifier and a signal reflected from the second TMN;
   a first control circuit configured to identify initial settings for the first TMN based on operating conditions of the radio, set a number of the first plurality of immittance elements based on the initial settings, monitor the ratio detected by the first VSWR detector, and repeatedly modify the initial settings of the first TMN based on the monitored ratio; and a second control circuit configured to set a number of the second plurality of immittance elements based on the initial settings, and modify the initial settings of the second TMN based on the power amplifier ratio detected by the second VSWR detector.

2. The apparatus of claim 1, wherein the first control circuit is configured to match a value of impedance for the at least one antenna with a value of impedance for the front end module by modifying settings of at least one of the first plurality of immittance elements in the first TMN.

3. The apparatus of claim 1 further comprising:
the power amplifier in the transceiver, the power amplifier operably connected to the second TMN,
wherein the second control circuit is configured to modify settings of at least one of the second plurality of immittance elements in the second TMN to achieve a value for the ratio that improves a performance parameter of the power amplifier.

4. The apparatus of claim 3, wherein the performance parameter of the power amplifier is at least one of a power added efficiency parameter, a gain parameter, a linearity parameter, a modulation quality parameter, and an output power parameter.

5. The apparatus of claim 1, wherein:
the first control circuit is configured to match a value of impedance for at least one antenna with a value of impedance for the front end module by modifying settings of the first plurality of immittance elements in the first TMN; and
the second control circuit configured to modify the initial settings of the second TMN to achieve a value for the power amplifier ratio that improves a performance parameter of the power amplifier based on the power amplifier ratio detected by the second VSWR detector.

6. The apparatus of claim 1 further comprising:
a modem configured to operate at an operating channel of frequencies, wherein the first control circuit is configured to identify at least some of the operating conditions of the radio by identifying the operating channel of frequencies from the modem.

7. The apparatus of claim 1 further comprising:
a storage device configured to store data regarding performance parameters of the radio,
wherein the first control circuit is configured to identify at least some of the operating conditions of the radio from the data stored in the storage device, wherein at least some of the initial settings for the first TMN are based on at least one of an operating channel of frequencies used by the radio, an operating mode of the radio, and parameters of components in the radio.

8. The apparatus of claim 1, wherein the radio is in a mobile station, wherein the initial settings for the first TMN are a preset based on known parameters of the mobile station, and wherein the first control circuit is configured to modify the initial settings of the first TMN based on changes in an operating environment of the mobile station.

9. The apparatus of claim 1 further comprising:
a storage device configured to store a table including settings for the first TMN based on the ratio detected by the first VSWR detector,
wherein the first control circuit is further configured to modify the initial settings of the first TMN based on the ratio detected and the settings in the table.

10. The apparatus of claim 1, wherein the ratio detected by the first VSWR detector is output from the first VSWR detector in a signal representing one of a magnitude of the signal reflected from the first TMN, a phase of the signal reflected from the first TMN, and both the magnitude and the phase of the signal reflected from the first TMN.

11. The apparatus of claim 1, wherein the first control circuit is configured to provide hybrid open and closed loop control of the first TMN, the open loop control comprising the identification of the initial settings for the first TMN based on operating conditions of the radio and the setting of the number of the first plurality of immittance elements based on the initial settings being the open loop control, the closed loop control comprising the monitoring of the ratio detected by the first VSWR detector and the modification of the initial settings for at least one of the first plurality of immittance elements based on the monitored ratio.

12. A method for managing impedance values in a radio in a wireless network, the method comprising:
identifying initial settings for a first tunable matching network (TMN) positioned between at least one antenna and a front end module based on operating conditions of the radio;
setting a number of a first plurality of immittance elements in the first TMN based on the initial settings;
detecting, by a first detector, a ratio of a signal passing the first detector from the front end module and a signal reflected from the first TMN;
repeatedly modifying the initial settings of the first TMN based on the ratio detected;
setting a number of a second plurality of immittance elements in a second TMN positioned on a path between a power amplifier and the front end module based on the initial settings;
detecting, by a second detector, a power amplifier ratio of a signal from the power amplifier and a signal reflected from the second TMN; and
modifying the initial settings of the second TMN based on the power amplifier ratio detected by the second detector.

13. The method of claim 12, wherein repeatedly modifying the initial settings of the first TMN based on the ratio detected comprises:
matching a value of impedance for the at least one antenna with a value of impedance for the front end module, wherein the front end module is operably connected to the first TMN and a transceiver.

14. The method of claim 12, wherein modifying the initial settings of the second TMN based on the ratio detected comprises:
modifying settings of at least one of the second plurality of immittance elements in the second TMN to achieve a value for the power amplifier ratio that improves a performance parameter of the power amplifier in a transceiver, wherein the power amplifier is operably connected to the second TMN.

15. The method of claim 12, wherein modifying the initial settings of the second TMN comprises modifying the initial settings of the second TMN to achieve a value for the power amplifier ratio that improves a performance parameter of the power amplifier based on the power amplifier ratio detected by the second detector.

16. The method of claim 12, wherein identifying the initial settings for the first TMN based on operating conditions of the radio comprises:

identifying an operating channel of frequencies from a modem in a transceiver, wherein the modem configured to operate at the operating channel of frequencies.

17. The method of claim 12, wherein identifying the initial settings for the first TMN based on operating conditions of the radio comprises:

identifying at least some of the operating conditions of the radio from data regarding performance parameters of the radio stored in a storage device, wherein at least some of the initial settings for the first TMN are based on at least one of an operating band of frequencies used by the radio, an operating channel used by the radio, an operating mode of the radio, and parameters of components in the radio.

18. The method of claim 12, wherein identifying the initial settings for the first TMN based on operating conditions of the radio comprises:

identifying a transmit operating frequency (TX) and a receive operating frequency (RX) for the radio, wherein the initial settings include a group of control variables for the first TMN, wherein the group of control variables are selected based on one of the TX, the RX, and a compromise for both TX and RX; and wherein repeatedly modifying the initial settings of the first TMN based on the ratio detected comprises:

modifying settings of the group of control variables.

19. A mobile station in a wireless network, the mobile station comprising:

an antenna;

a front end module;

a power amplifier;

a first tunable matching network (TMN) operably connected to the front end module and the antenna, the first TMN comprising a first plurality of immittance elements;

a first voltage standing wave ratio (VSWR) detector configured to detect an antenna ratio of a signal from the front end module and a signal reflected from the first TMN;

a second TMN operably connected to the front end module and the power amplifier, the second TMN comprising a second plurality of immittance elements;

a second VSWR detector configured to detect a power amplifier ratio of a signal from the power amplifier and a signal reflected from the second TMN; and a control circuit configured to identify an operating setting for mobile station, set a number of the first plurality of immittance elements and a number of the second plurality of immittance elements based on the operating setting, modify settings of at least one of the first plurality of immittance elements in the first TMN based on the antenna ratio detected by the first VSWR detector to match a value of impedance for the antenna with a value of impedance for the front end module, and modify settings of the second plurality of immittance elements in the second TMN to achieve a value for the power amplifier ratio that improves a performance parameter of the power amplifier based on the power amplifier ratio detected by the second VSWR detector.

20. The mobile station of claim 19 further comprising:

a modem configured to operate at an operating band and channel of frequencies, wherein the control circuit is configured to identify the operating setting for the mobile station by identifying the operating channel of frequencies from the modem.

21. The mobile station of claim 19 further comprising:

a storage device configured to store data regarding performance parameters of the mobile station, wherein the control circuit is configured to identify the operating setting for the mobile station from the data stored in the storage device, wherein the operating setting of the mobile station is based on at least one of an operating band of frequencies used by the mobile station, an operating channel used by the radio, an operating mode of the mobile station, and parameters of components in the mobile station.

* * * * *